US012575191B2

(12) United States Patent
Subramanyam et al.

(10) Patent No.: US 12,575,191 B2
(45) Date of Patent: Mar. 10, 2026

(54) LOW CAPACITANCE ESD PROTECTION DEVICES

(71) Applicant: TEXAS INSTRUMENTS INCORPORATED, Dallas, TX (US)

(72) Inventors: Sreeram Nasum Subramanyam, Bangalore (IN); Shraddha Balasaheb Keripale, Kolhapur (IN); Chinna Veerappan Venkatachalam, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 741 days.

(21) Appl. No.: 17/955,926

(22) Filed: Sep. 29, 2022

(65) Prior Publication Data

US 2024/0113098 A1 Apr. 4, 2024

(51) Int. Cl.
| | |
|---|---|
| *H10D 8/60* | (2025.01) |
| *H01L 23/00* | (2006.01) |
| *H01L 25/065* | (2023.01) |
| *H10D 89/60* | (2025.01) |
| *H10D 8/25* | (2025.01) |

(52) U.S. Cl.
CPC .......... *H10D 89/611* (2025.01); *H01L 24/48* (2013.01); *H01L 24/49* (2013.01); *H01L 25/0655* (2013.01); *H01L 2224/48137* (2013.01); *H01L 2224/4911* (2013.01); *H01L 2224/4917* (2013.01); *H10D 8/25* (2025.01); *H10D 8/60* (2025.01)

(58) Field of Classification Search
CPC .......... H10D 89/611; H10D 8/25; H10D 8/60; H10D 89/60; H01L 24/48; H01L 25/0655; H01L 2224/48137; H01L 2224/4911; H01L 2224/4917; H01L 24/49; H01L 23/60; H01L 25/072

USPC ......................................................... 257/355
See application file for complete search history.

(56) References Cited

U.S. PATENT DOCUMENTS

| | | | |
|---|---|---|---|
| 7,755,870 B2 * | 7/2010 | Arai ..................... | H10D 89/611 |
| | | | 361/111 |
| 2014/0036399 A1 * | 2/2014 | Ory ......................... | H01L 23/62 |
| | | | 361/56 |

OTHER PUBLICATIONS

"System Level ESD Protection Guide", Texas Instruments Incorporated, dated 2018, 19 pages.

* cited by examiner

*Primary Examiner* — Monica D Harrison
(74) *Attorney, Agent, or Firm* — Xianghui Huang; Frank D. Cimino

(57) ABSTRACT

Examples of low capacitance bidirectional and unidirectional electrostatic discharge (ESD) protection devices for high voltage (e.g., 15 kV, 30 kV) applications are provided. Such devices include a circuit of a diode and a Zener diode coupled via their anodes to form an NPN structure and another, low capacitance diode coupled in series with the NPN structure. Such circuit may be configured on each of two dies, and the circuits coupled via wire bonds. Additional wire bonds may be used to respectively couple two pins of the device to the two circuits, or the pins may be coupled to the circuits via respective conductive die attaches. In a multichip module (MCM) topology, the NPN diode structure may be coupled to two low capacitance diodes on one die, and that circuit may be coupled to a third low capacitance diode disposed on another die. Some arrangements employ an insulator in conjunction with a single die. Some arrangements enable FlipChip fabrication technology.

19 Claims, 13 Drawing Sheets

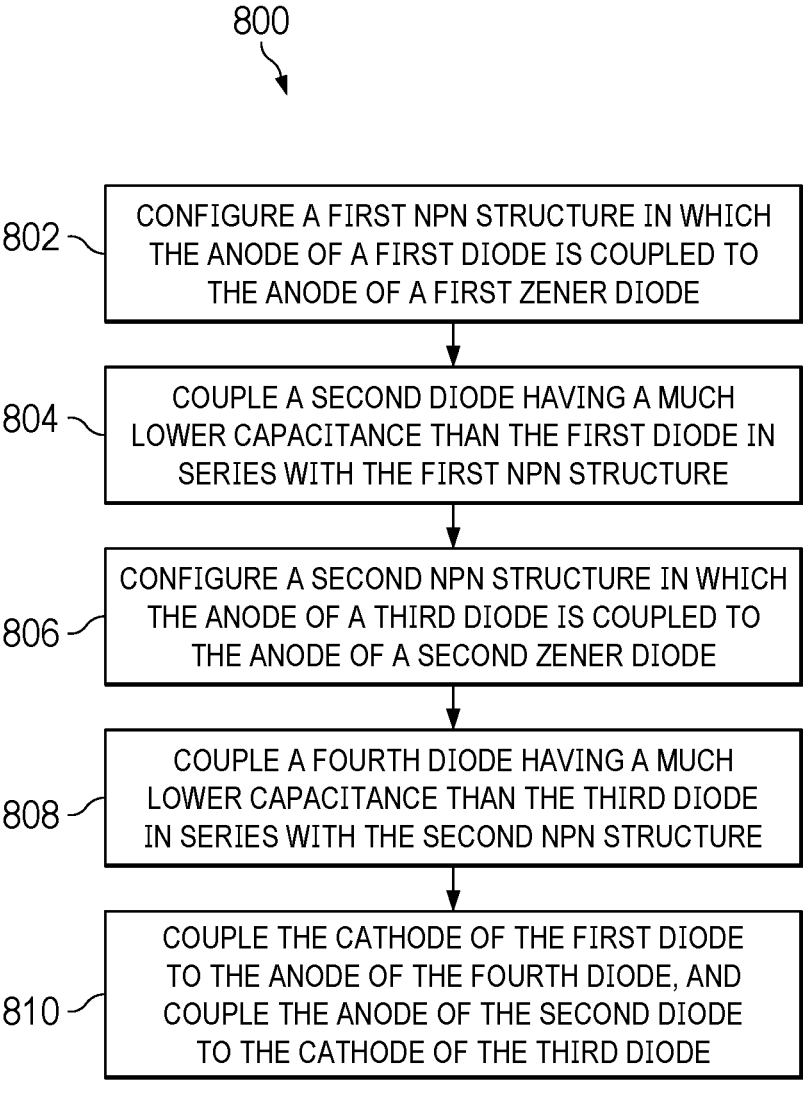

800

802 — CONFIGURE A FIRST NPN STRUCTURE IN WHICH THE ANODE OF A FIRST DIODE IS COUPLED TO THE ANODE OF A FIRST ZENER DIODE

804 — COUPLE A SECOND DIODE HAVING A MUCH LOWER CAPACITANCE THAN THE FIRST DIODE IN SERIES WITH THE FIRST NPN STRUCTURE

806 — CONFIGURE A SECOND NPN STRUCTURE IN WHICH THE ANODE OF A THIRD DIODE IS COUPLED TO THE ANODE OF A SECOND ZENER DIODE

808 — COUPLE A FOURTH DIODE HAVING A MUCH LOWER CAPACITANCE THAN THE THIRD DIODE IN SERIES WITH THE SECOND NPN STRUCTURE

810 — COUPLE THE CATHODE OF THE FIRST DIODE TO THE ANODE OF THE FOURTH DIODE, AND COUPLE THE ANODE OF THE SECOND DIODE TO THE CATHODE OF THE THIRD DIODE

FIG. 8

LOW CAPACITANCE ESD PROTECTION DEVICES

FIELD OF DISCLOSURE

This disclosure relates generally to low capacitance electrostatic discharge (ESD) protection devices, as well as to low capacitance topologies for ESD devices.

BACKGROUND

System-level protection for ESD is important in many applications in the industrial space, as well as in the consumer and automotive spaces. ESD is the sudden release of electricity from one charged object to another when the two objects come into contact. When the objects are sensitive integrated circuits (ICs), even a single ESD strike of sufficient magnitude can permanently damage a product or component(s) thereof. Without ESD protection, the relatively high voltage of an ESD strike via an interface connection would cause a relatively large current to flow directly into a connected IC, causing damage. Thus, ESD protection is an important consideration in many system designs. Moreover, some applications, such high-speed signaling and radio frequency (RF) antennas, require very low capacitance ESD protection devices (e.g., <1 pF for 30 kV protection and <0.5 pF for 15 kV protection), so as not to interfere with the normal operation of the system, e.g., communication between multiple ICs of the system.

Prior solutions offer relatively low capacitance for working voltages of less than 5 V. However, for working voltages of greater than 12 V, the diode area increases and thus capacitance also increases to greater than 2 pF. Protection for working voltages of greater than 12 V is important for RF antenna protection and for automotive high-speed data lines. For example, there is a need for a 24 V ESD protection device with 30 kV IEC-ESD and <1 pF capacitance. In this context, features and aspects of the present disclosure arise.

SUMMARY

In an example, an electrostatic discharge (ESD) protection device comprises a first circuit including a first diode, a second diode, and a first Zener diode, in which the anode of the first diode is coupled to the anode of the first Zener diode to form a first NPN structure. The ESD protection device further comprises a second circuit including a third diode, a fourth diode, and a second Zener diode, in which the anode of the third diode is coupled to the anode of the second Zener diode to form a second NPN structure. The second diode is coupled in series to the first NPN structure, and the fourth diode is coupled in series to the second NPN structure.

In an example, an ESD protection device comprises a first diode and a Zener diode, in which the anode of the first diode is coupled to an anode of the Zener diode to form an NPN structure. The ESD protection device further comprises a second diode, the anode of which is coupled to the cathode of the first diode and the cathode of which is coupled to the cathode of the Zener diode. The ESD protection device further comprises third and fourth diodes. The cathode of the third diode is coupled to the cathode of the Zener diode and to the cathode of the second diode, and the cathode of the fourth diode is coupled to the anode of the third diode.

In an example, a method of making an ESD protection device comprises forming, on a substrate, first and second dies and first and second terminals of the ESD protection device; and forming, on the first die, a first circuit including a first diode, a second diode, and a first Zener diode. In connection with this forming operation, the anode of the first diode is coupled to the anode of the first Zener diode to form a first NPN structure, and the second diode is coupled in series with the first NPN structure. The method further comprises forming, on the second die, a second circuit including a third diode, a fourth diode, and a second Zener diode, in which the anode of the third diode is coupled to the anode of the second Zener diode to form a second NPN structure, and the fourth diode is coupled in series with the second NPN structure.

In an example, a method of making an ESD protection device comprises forming, on a substrate, first and second dies and first and second terminals of the ESD protection device; and forming, on the first die, a first circuit including a first diode, a second diode, a third diode, and a Zener diode. In connection with this forming operation, the anode of the first diode is coupled to the anode of the first Zener diode to form a first NPN structure, and the second diode is coupled in series with the first NPN structure. The method further comprises forming, on the second die, a fourth diode; and coupling the anode of the third diode to the cathode of the fourth diode.

These and other features will be better understood from the following detailed description with reference to the accompanying drawings.

BRIEF DESCRIPTION OF THE DRAWINGS

Features of the disclosure may be understood from the following figures taken in conjunction with the detailed description.

FIG. 8 is a flow chart of an example method of configuring an example ESD protection device.

DETAILED DESCRIPTION

Figure 1A:
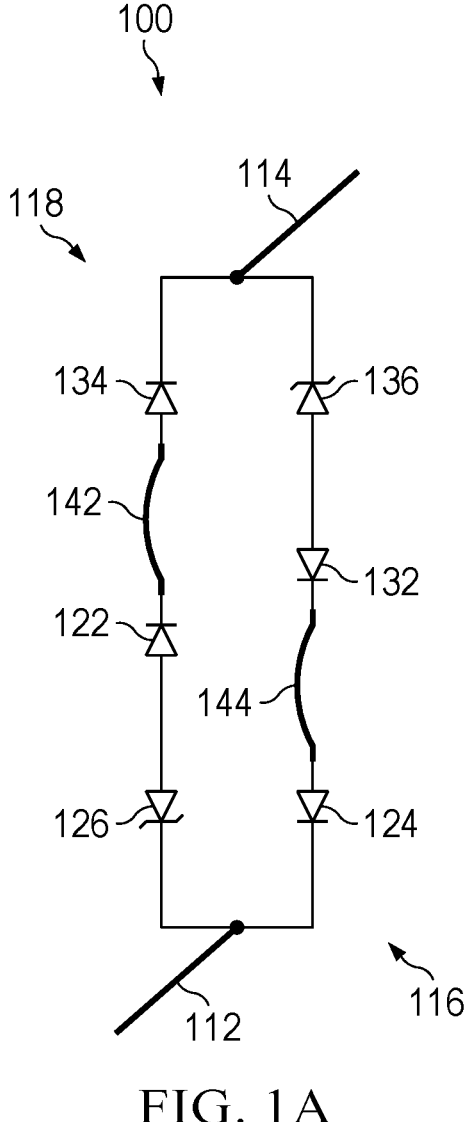
FIG. 1A is a schematic diagram of a first example of a bidirectional electrostatic discharge (ESD) protection device.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

Examples configurations of bidirectional and unidirectional electrostatic discharge (ESD) protection devices with very low capacitance are provided. In example topologies, a lower capacitance diode is coupled in series with an NPN structure formed by a higher capacitance diode and a Zener diode. Such circuit structure may be disposed on both dies in a two-die configuration. Example bidirectional implementations with capacitances of less than 1 pF (~0.75 pF) and less than 0.5 pF (~0.4 pF) are able to withstand ESD events up to ~30 kV and ~15 kV, respectively. An example unidirectional structure may be implemented using multichip module (MCM) topology. To provide up to 30 kV ESD protection, the circuitry of the unidirectional structure may be configured with only one lower capacitance diode on the second die to thus reduce the area of the second die and pin-to-pin capacitance (resulting, e.g., from the wire bonds and conductive die attach pads). A unidirectional structure with ~30 kV protection is able to provide <1 pF capacitance (~0.75 pF capacitance), and a single-die structure with ~15 kV protection is able to provide <0.5 pF capacitance (~0.4 pF capacitance). Variations include flip-chip-on-lead (FCOL) and single-die constructions. Various pin coupling arrangements may be utilized to couple the pins of the ESD protection device to the diode circuits. The ESD devices may be fabricated using semiconductor process technology, such as Ultra Low Capacitance (ULC) diode technology.

Figure 1B:
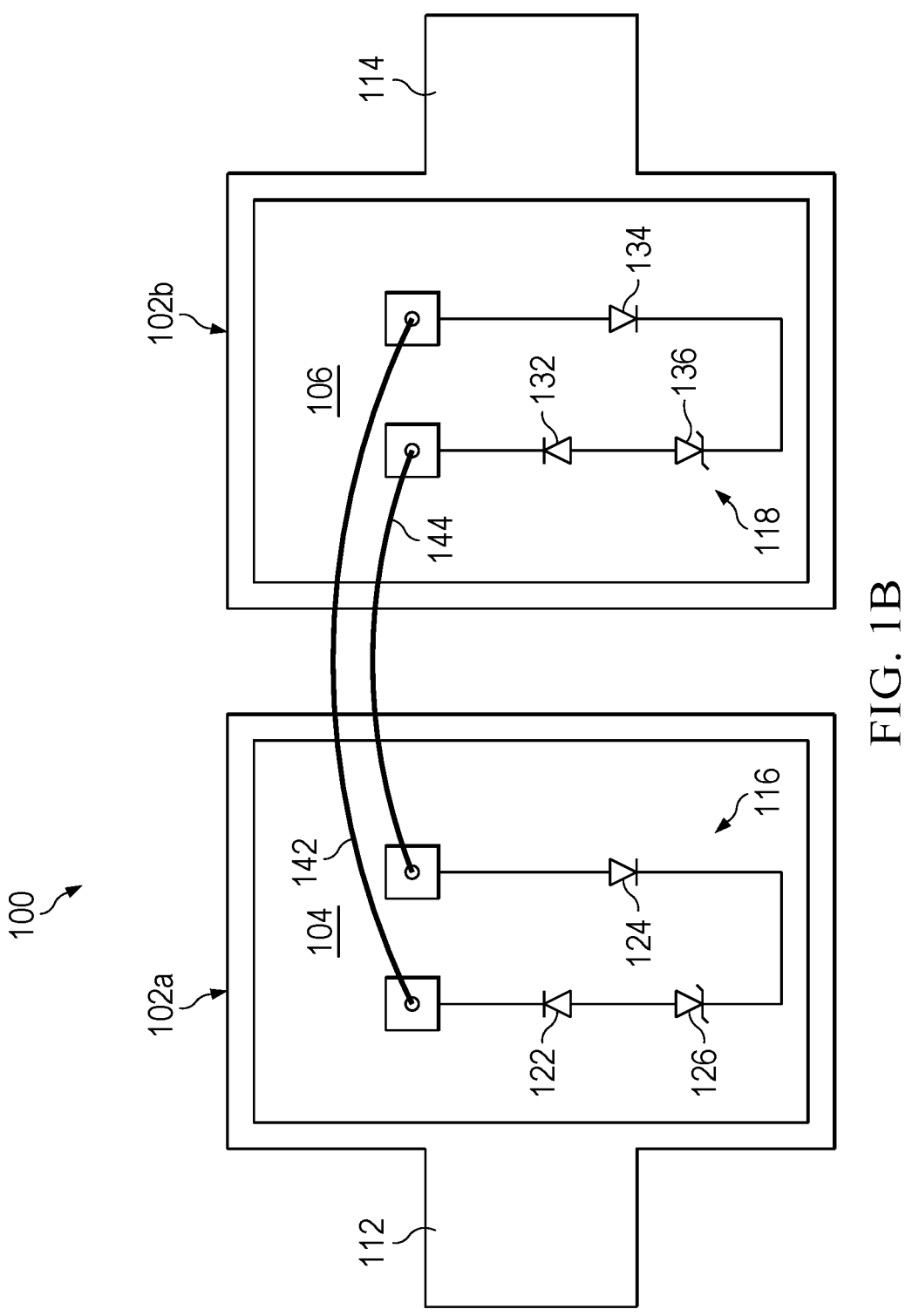
FIG. 1B is a top view of a structural representation of the example bidirectional ESD device of FIG. 1A.
Figure 1C:
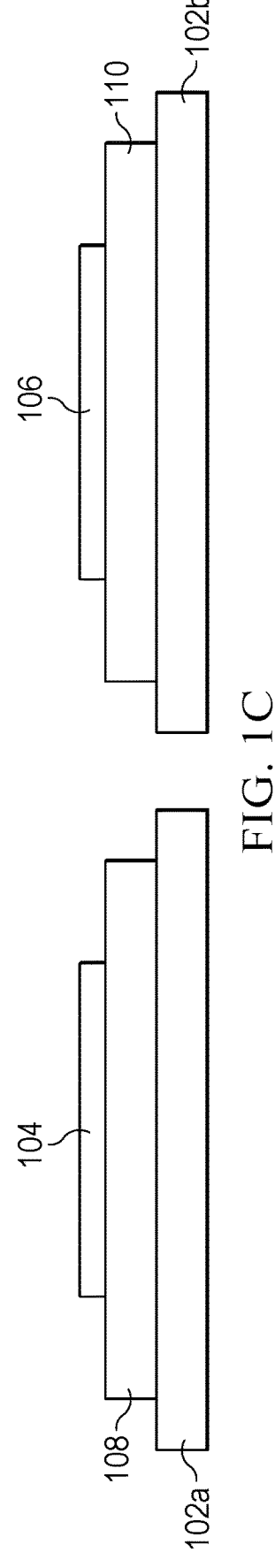
FIG. 1C is a side view of dies and die attach pads of the example device of FIG. 1A.

FIG. 1A is a schematic diagram of a bidirectional electrostatic discharge (ESD) protection device 100, FIG. 1B is a top view of a structural representation of device 100, and FIG. 1C is a side view of dies and die attach pads of the device of FIG. 1A. FIGS. 1A, 1B and 1C may be collectively referred to simply as FIG. 1.

As shown in FIG. 1, bidirectional ESD protection device 100 includes two substrate portions 102a and 102b, which may be disposed on the same layering level. A first die 104 is mounted on substrate portion 102a, and a second die 106 is mounted on substrate portion 102b. Conductive die attach pads 108 and 110 are used to mount dies 104 and 106 to substrate portions 102a and 102b, respectively. Each die attach pad 108, 110 has a metal surface to which corresponding substrate portion 102a, 102b is coupled. ESD protection device has first and second pins 112 and 114 for external connection. First pin 112 is formed as part of, or is coupled to, substrate portion 102a. Second pin 114 is formed as part of, or is coupled to, substrate portion 102b.

First die 104 includes a first circuit 116, and second die 106 includes a second circuit 118. First circuit 116 includes first and second diodes 122 and 124, in which second diode 124 has a significantly lower capacitance than first diode 122. First circuit 116 also includes a Zener diode 126. The anodes of first diode 122 and first Zener diode 126 are coupled together to form a first NPN structure. In addition, the cathodes of first Zener diode 126 and second diode 124 are coupled together. Second circuit 118 includes a third diode 132, and a fourth diode 134 having significantly lower capacitance than third diode 132. Second circuit 118 also includes a second Zener diode 136 with its anode coupled to the anode of third diode 132 to form a second NPN structure. The cathode of second Zener diode 136 is coupled to the cathode of fourth diode 134.

First pin 112 is bonded to first circuit 116 via the node formed by the common cathode coupling of second diode 124 and first Zener diode 126. Similarly, second pin 114 is bonded to second circuit 118 via the node formed by the common cathode coupling of fourth diode 134 and second Zener diode 136.

Bidirectional ESD protection device 100 further includes first and second bond wires or connectors 142 and 144. First bond wire 142 couples the cathode of first diode 122 to the anode of fourth diode 134. Second bond wire 144 couples the anode of second diode 124 to the cathode of third diode 132.

With the configuration shown in FIG. 1, each of the lower capacitance diodes, i.e., second and fourth diodes 124 and 134, respectively, is in series with the first NPN structure formed by first diode 122 and first Zener diode 126 and is also in series with the second NPN structure formed by third diode 132 and second Zener diode 136. During a strike, each of first, second, third and fourth diodes 122, 124, 132 and 134 is in forward conduction mode, and each of first and second Zener diodes 126 and 136 is in reverse breakdown mode.

Figure 2:
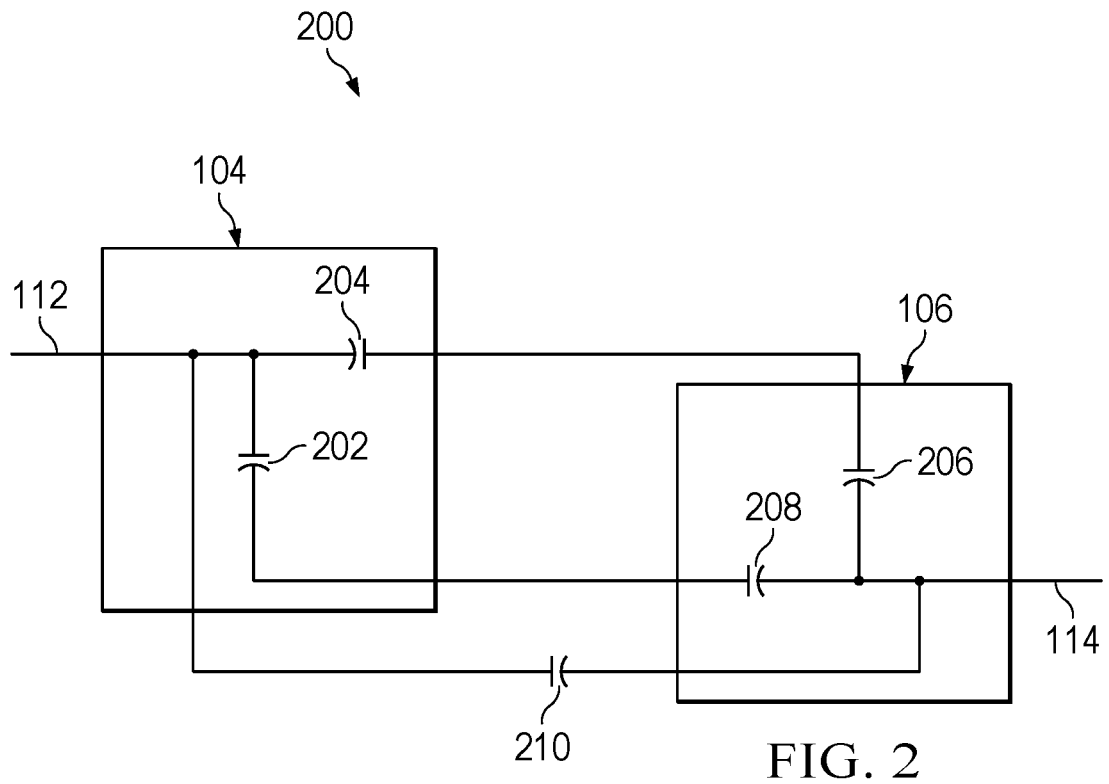
FIG. 2 is a diagram showing a capacitance model of the example bidirectional ESD protection device of FIG. 1.

FIG. 2 shows a capacitance model 200 of example bidirectional ESD protection device 100 of FIG. 1. Capacitor 202 represents the combined capacitances of first diode 122 and first Zener diode 126, capacitor 204 represents the capacitance of second diode 124, capacitor 206 represents the combined capacitances of third diode 132 and second Zener diode 136, and capacitor 208 represents the capacitance of fourth diode 134. Capacitor 210 represents the parasitic capacitance from die attach pads 108 and 110 and bond wires 142 and 144. During a strike, the parasitic capacitance of device 100 does not come into parallel to either of the lower capacitance diodes, i.e., second and fourth diodes 124 and 134, respectively.

Figure 3A:
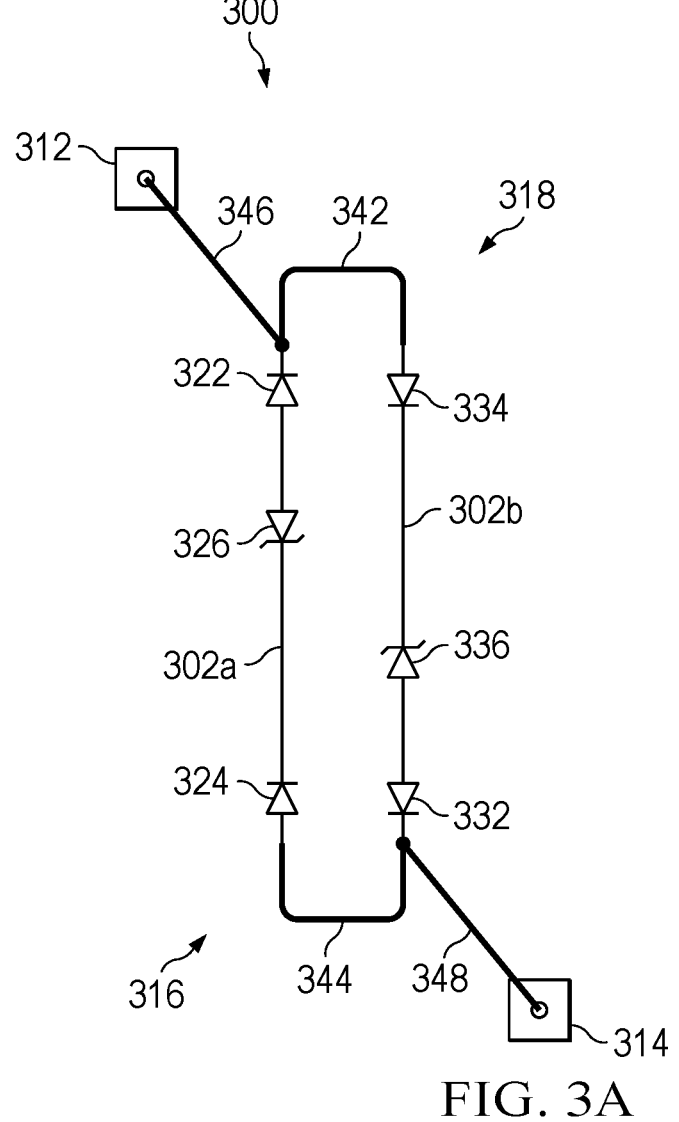
FIG. 3A is a schematic diagram of a second example of a bidirectional ESD protection device.
Figure 3B:
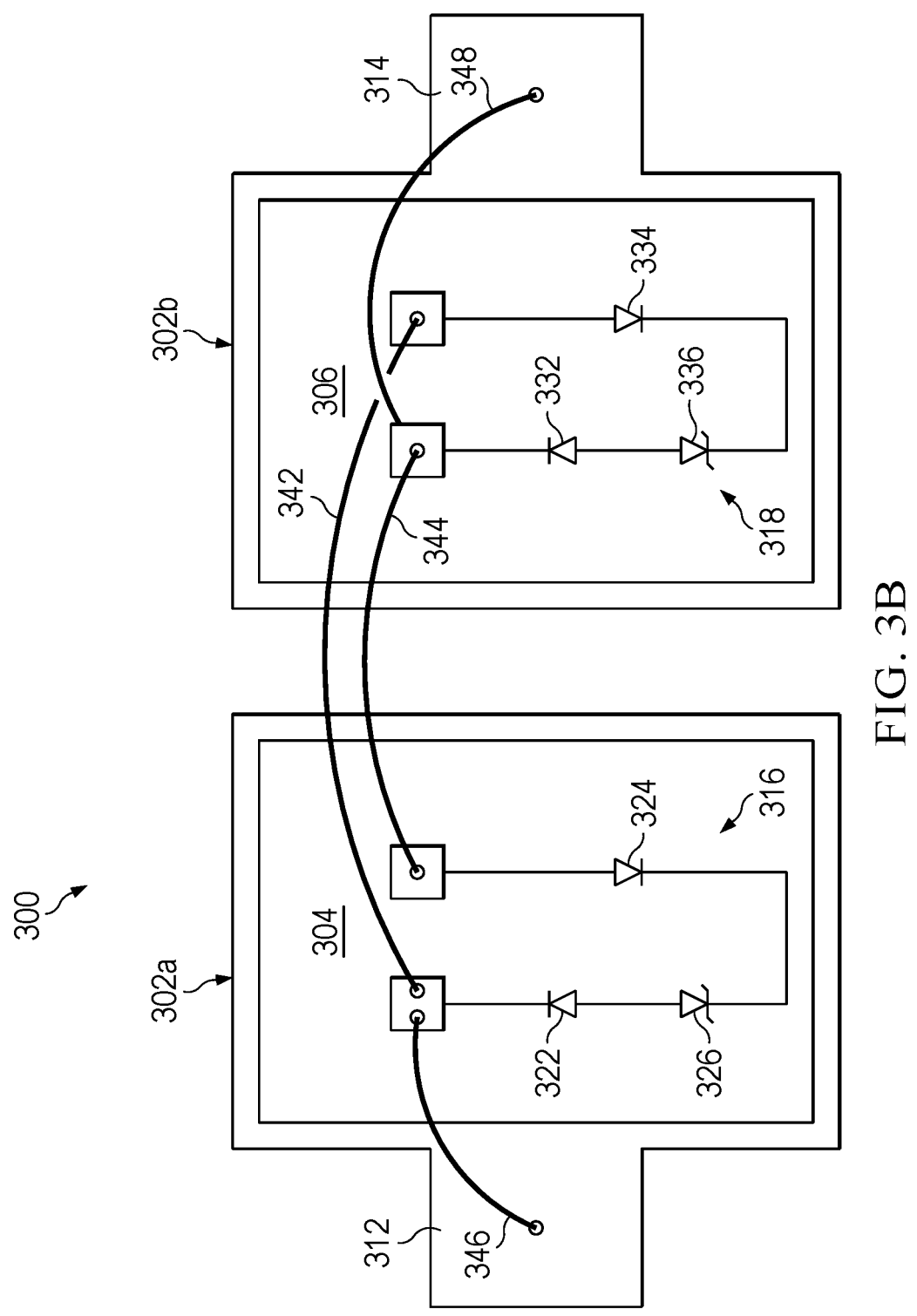
FIG. 3B is a top view of a structural representation of the example bidirectional ESD device of FIG. 3A.

FIG. 3A is a schematic diagram of a second example of a bidirectional ESD protection device 300, and FIG. 3B is a top view of a structural representation of device 300. FIGS. 3A and 3B may be collectively referred to as FIG. 3.

Bidirectional ESD protection device 300 is similar in various respects to bidirectional ESD protection device 100. First and second dies 304 and 306 are mounted on substrate portions 302a and 302b, respectively, via non-conductive die attach pads. Such mounting arrangement is similar to that shown in FIG. 1C, except that in device 300 the attaching surface of the die attach pads need not be metal or conductive die attach, enabling fabrication of device 300 without needing backside metal.

Similar to device 100, device 300 has first and second circuits, which are each similarly configured to their respective counterparts in FIG. 1. In the embodiment of FIG. 3, first circuit 316 is formed on die 304, and second circuit 318 is formed on die 306.

First circuit 316 includes a first diode 322 and a first Zener diode 326 coupled together at their anode terminals to form a first NPN structure. The cathode of a second diode 324 having a significantly lower capacitance than first diode 322 is coupled to the cathode of first Zener diode 326. Second circuit 318 includes a third diode 332, a fourth diode 334 having significantly lower capacitance than third diode 332, and a second Zener diode 336. The common anode coupling of third diode 332 and second Zener diode 336 form a second NPN structure. The cathode of second Zener diode 336 is coupled to the cathode of fourth diode 334.

First and second circuits 316 and 318 are coupled together via first and second bond wires 342 and 344. First bond wire 342 extends between the cathode of first diode 322 and the anode of fourth diode 334, while second bond wire 344 extends between the anode of second diode 324 and the cathode of third diode 332.

Two additional bond wires, third bond wire 346 and fourth bond wire 348, are used to couple first and second pins 312 and 314, respectively, to first and second circuits 316 and 318, respectively. Third bond wire 346 couples first pin 312 to the cathode of first diode 322, and fourth bond wire 348 couples second pin 314 to the cathode of third diode 332.

As in the embodiment of FIG. 1, in the embodiment of FIG. 3, first and second pins 312 and 314 provide external connection for device 300 and are formed as part of, or as coupled to, substrate portion 302a and 302b, respectively.

Figure 4:
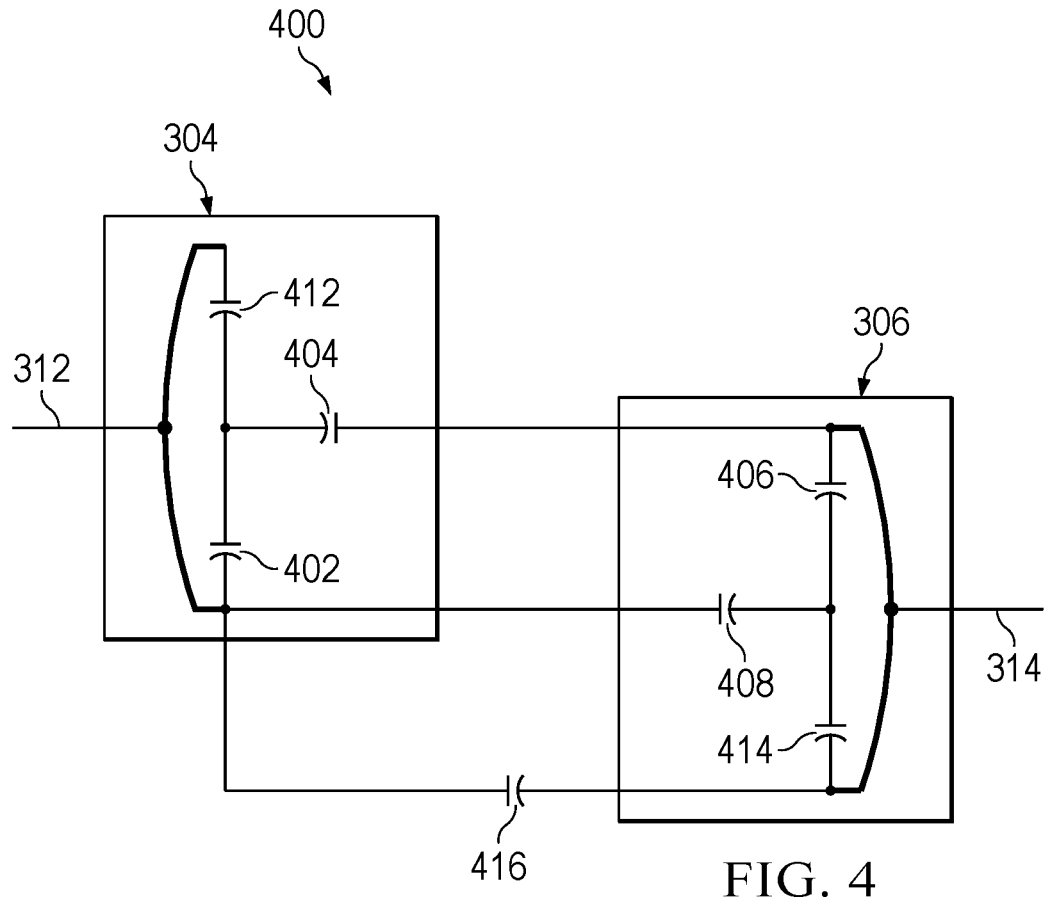
FIG. 4 is a diagram showing a capacitance model of the example bidirectional ESD protection device of FIG. 3.

FIG. 4 shows a capacitance model 400 of example bidirectional ESD protection device 300 of FIG. 3. Capacitor 402 represents the combined capacitances of first diode 322 and first Zener diode 326, capacitor 404 represents the capacitance of second diode 324, capacitor 406 represents the combined capacitances of third diode 332 and second Zener diode 336, and capacitor 408 represents the capacitance of fourth diode 334. The capacitance resulting from the coupling of substrate 302a to its associated die attach pad is represented by capacitor 412, and the capacitance resulting from the coupling of substrate 302b to its associated die attach pad is represented by capacitor 414. Capacitor 416 represents the pin-to-pin parasitic capacitance from die attach pads and bond wires 342 and 344 (denoted $C_{DAP\_DAP}$). During a strike, the parasitic capacitance of device 300 does not come into parallel to either of the lower capacitance diodes, i.e., second and fourth diodes 324 and 334, respectively. Moreover, the total capacitance of die 304 is approximately the capacitance of diode 324 (i.e., the capacitance represented by capacitor 404), and the total capacitance of die 306 is approximately the capacitance of diode 334 (i.e., the capacitance represented by capacitor 408). Thus, with the capacitance of each of capacitor 404 and 408 approximately equal and denoted by $C_{D2}$, the total capacitance of bidirectional ESD protection device 300 is less than $2*C_{D2}+C_{DAP\_DAP}$, i.e., approximately $1.8*C_{D2}+C_{DAP\_DAP}$.

For 30 kV applications in which the area of each of the lower capacitance diodes (i.e., diodes 324 and 334) of device 300 is approximately 4600 sq. μm, the capacitance of each such diode is approximately 0.5 pF, the combined capacitance of first diode 322 and first Zener diode 326 (represented by capacitor 402) is approximately 6 pF, and the total capacitance of device 300 is approximately 1.06 pF. Reducing the area of each lower capacitance diode by approximately half reduces the capacitance of each such diode by more than half to approximately 0.2 pF, thus reducing the total capacitance of device 300 to approximately 0.58 pF for 30 kV applications.

For 15 kV applications in which the area of each of the lower capacitance diodes (i.e., diodes 324 and 334) of device 300 is approximately 2300 sq. μm, the capacitance of each such diode is approximately 0.25 pF, the combined capacitance of first diode 322 and first Zener diode 326 (represented by capacitor 402) is approximately 3 pF, and the total capacitance of device 300 is approximately 0.64 pF. Reducing the area of each lower capacitance diode by approximately half reduces the capacitance of each such diode by more than half to approximately 0.1 pF, thus reducing the total capacitance of device 300 to approximately 0.39 pF for 15 kV applications.

The pin-to-pin capacitance, which contributes to total device capacitance, is approximately the same (i.e., approximately 0.2 pF) in each of the above-identified applications.

Figure 5A:
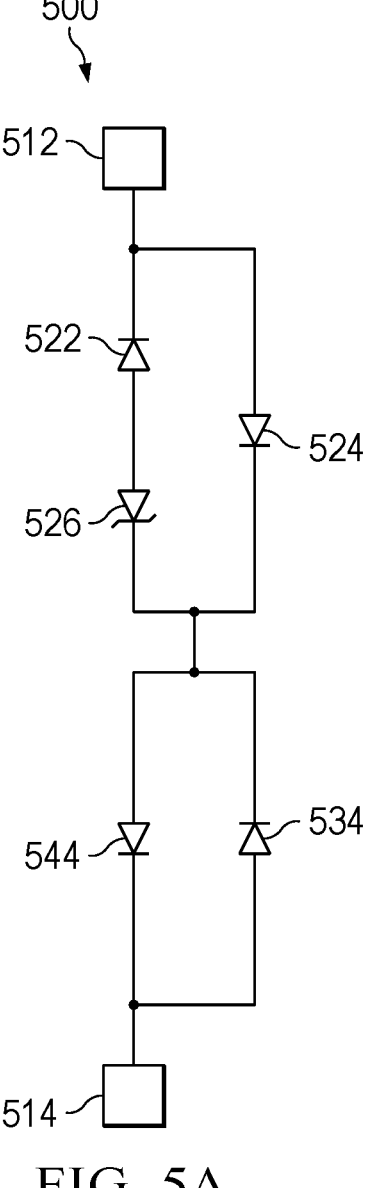
FIG. 5A is a schematic diagram of an example unidirectional ESD protection device.
Figure 5B:
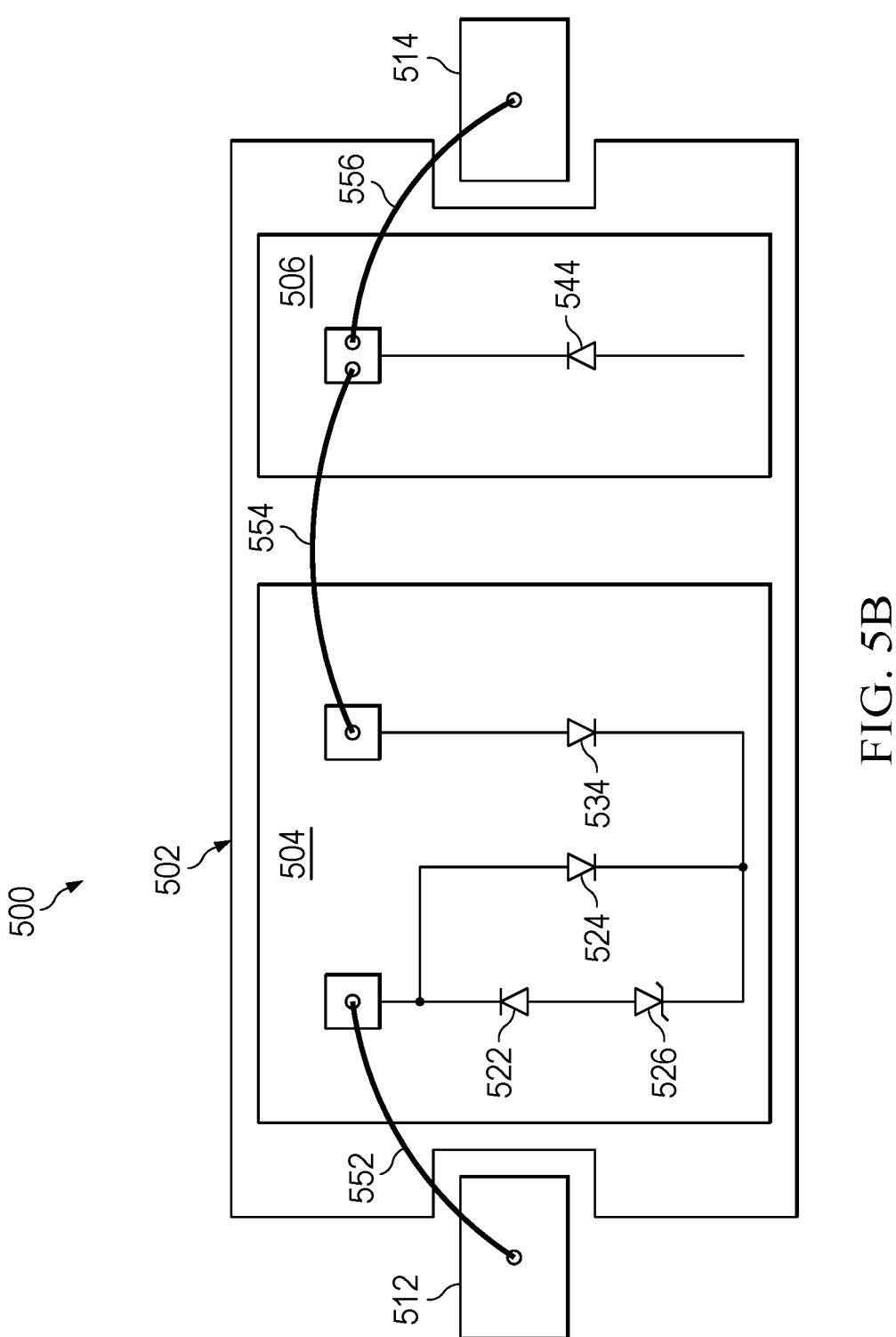
FIG. 5B is a top view of a structural representation of the example unidirectional ESD device of FIG. 5A.

An example of a unidirectional ESD protection device 500 is shown in FIGS. 5A and 5B (collectively, FIG. 5), where FIG. 5A is a schematic diagram of device 500 and FIG. 5B is a top view of a structural representation of device 500. Device 500 may be implemented using multichip module (MCM) topology, which employs conductive die attach pads with tie bars. Each die attach pad has a conductive surface to attach a respective one of first and second dies 504 and 506 to main substrate 502. Such mounting arrangement is similar to that shown in FIG. 1C, except the die attach pads are mounted on a single continuous piece of substrate (i.e., main substrate 502). Pins 512 and 514, which are formed of substrate material, are separated from main substrate 502. Second die 506 may be configured upside down.

Four (4) diodes are formed on first die 504. A first diode 522 and a Zener diode 526 are coupled at their anode terminals to form an NPN structure. The cathodes of second and third diodes 524 and 534, respectively, are coupled to the cathode of Zener diode 526. The anode of second diode 524 is coupled to the cathode of first diode 522 to form a connection node for coupling to first pin 512. That is, a tie bar 552 extends between this connection node and first pin 512, coupling the circuitry on die 504 to first pin 512.

A fourth diode 544 is formed on die 506. A wire bond 554 couples the cathode of fourth diode 544 to the anode of third diode 534. A tie bar 556 couples the cathode of fourth diode 544 to second pin 514.

Each of the second, third and fourth diodes 524, 534 and 544 has a significantly lower capacitance than that of first diode 522. In an example, the capacitance of diodes 524, 534 and 544 is the same ($C_{D2}$), in which case the total capacitance of unidirectional ESD protection device 500 is approximately $1.5*C_{D2}$+the pin-to-pin capacitance.

Figure 6:
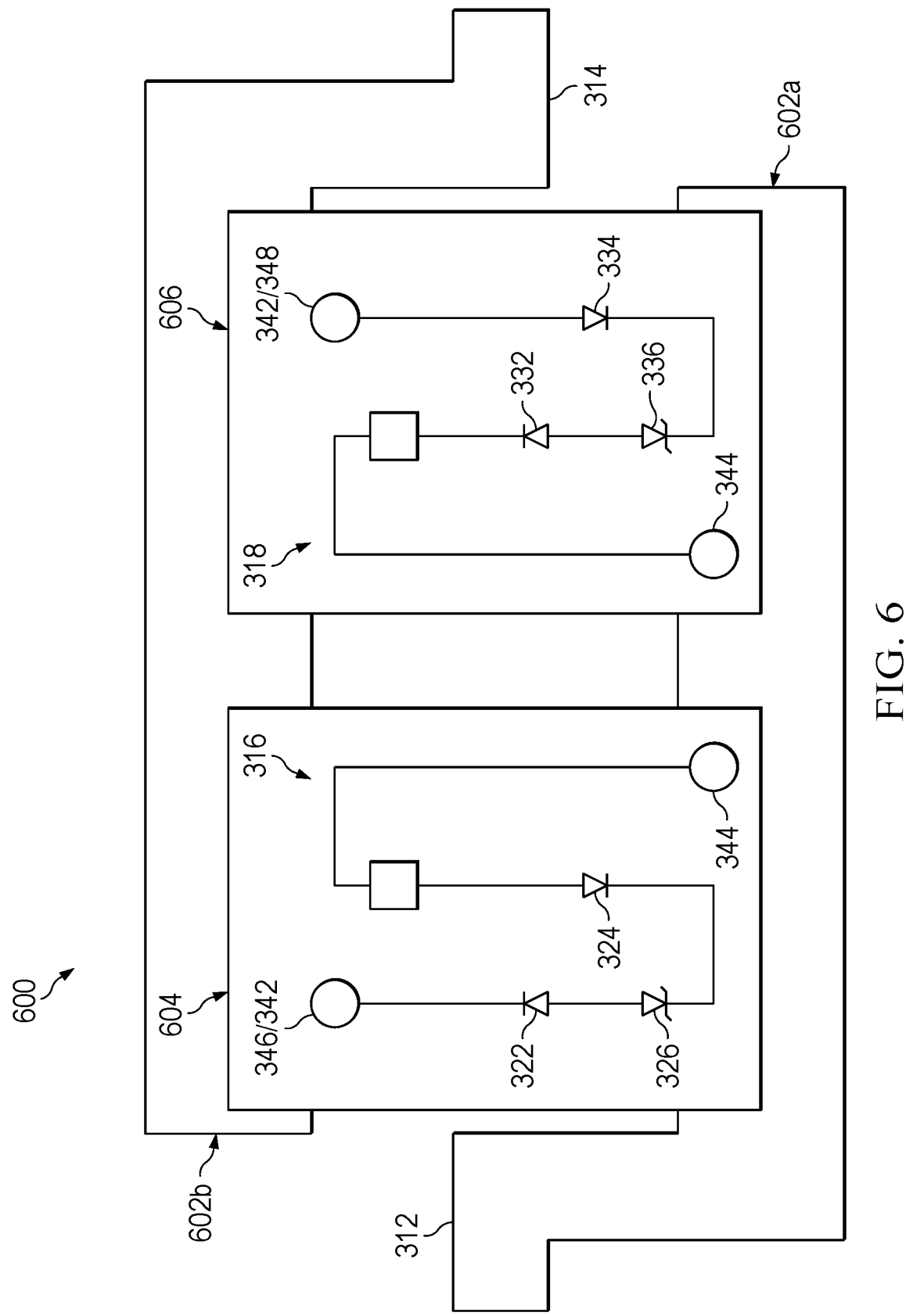
FIG. 6 is first implementation variation of the example bidirectional ESD protection device of FIG. 3.

FIG. 6 is first implementation variation of the example bidirectional ESD protection device of FIG. 3. Bidirectional ESD protection device 600 may be packaged using flip-chip-on-lead (FCOL), in which bumped dies 604 and 606 may be mounted in part on substrate portions 602a and 602b and in part on a leadframe (not shown) along with passive components and then overmolded. FCOL may increase usable die to package area to reduce capacitance. Device 600 contains many of the same elements as device 300; thus, each element that is the same or substantially the same as a counterpart element in FIG. 3 is given the same reference numeral. Wire bonds 342, 344, 346 and 348 are shown in cross-section, with the common coupling of wire bonds 342 and 346 at the cathode of diode 322 shown as a single wire and the common coupling of wire bonds 342 and 348 at the anode of diode 334 also shown as a single wire.

Figure 7A:
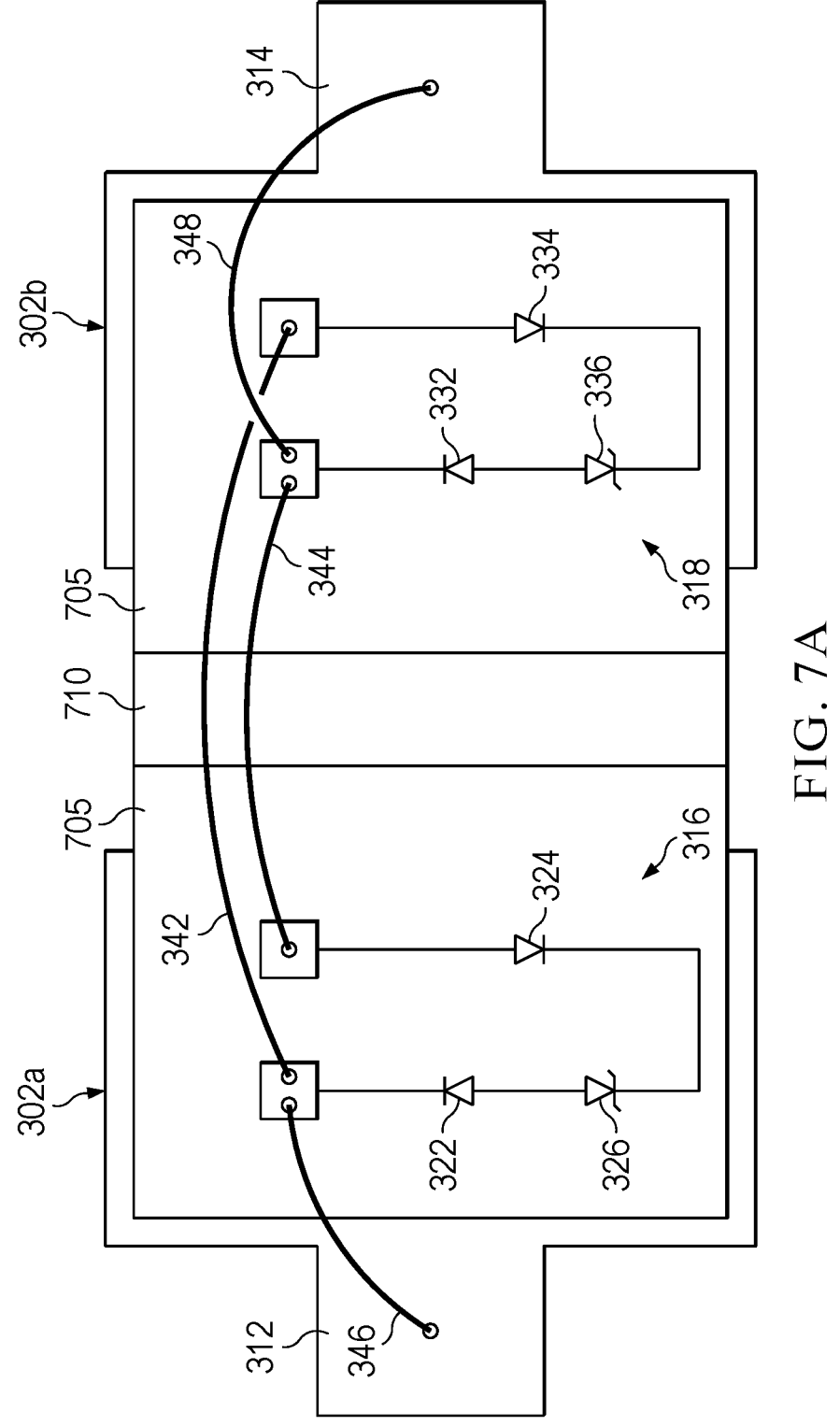
FIGS. 7A and 7B are diagrams of a second implementation variation of the example bidirectional ESD protection device of FIG. 3.
Figure 7B:
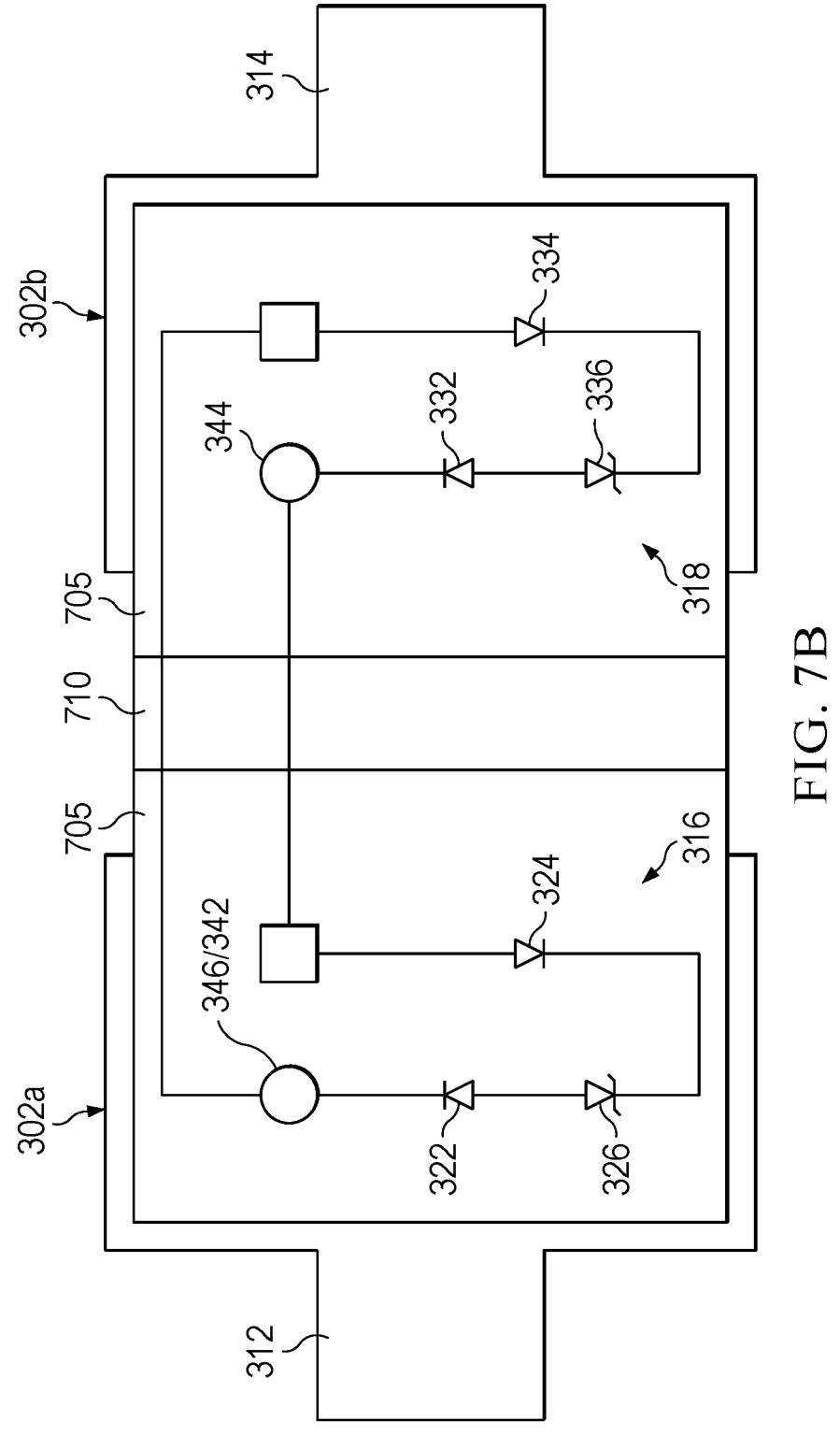

FIGS. 7A and 7B are diagrams of a second implementation variation of the bidirectional ESD protection device of FIG. 3. Both implementations employ a single die 705 and an insulator 710 to increase useable die to package area and reduce capacitance. Other elements are similar to their respective counterparts in FIG. 3 and thus are identified by the same reference numerals. FIG. 8 is a flow diagram of an example method 800 of configuring an example ESD protection device. In operation 802, a first NPN structure is configured by coupling the anode of a first diode to the anode of a first Zener diode. A second diode having a much lower capacitance than the first diode is coupled in series with the first NPN structure in operation 804. Such series coupling may be made by coupling the cathode of the second diode to the cathode of the first Zener diode. In operation 806, a second NPN structure is configured by coupling the anode of a third diode to the anode of a second Zener diode. A fourth diode having a much lower capacitance than the third diode is coupled in series with the second NPN structure in operation 808. Such series coupling may be made by coupling the cathode of the fourth diode to the cathode of the second Zener diode. The first and second diodes, as well as the first Zener diode, may be considered a first circuit, and the third and fourth diodes, as well as the second Zener diode, may be considered a second circuit. To couple the two circuits together, in operation 810, the cathode of the first diode is coupled to the anode of the fourth diode, and the anode of the second diode is coupled to the cathode of the third diode in operation 810.

FIG. 8 depicts one possible set and order of operations. Not all operations need necessarily be performed in the order described. Some operations may be combined into a single operation. Additional operations and/or alternative operations may be performed consistent with the teachings herein.

Examples of improved bidirectional and unidirectional electrostatic discharge (ESD) protection devices are provided. In examples, an ESD device includes a circuit of diode and a Zener diode coupled via their anodes to form an NPN structure and another diode coupled in series the NPN structure. Two such circuits may be formed and coupled together.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e. programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the term "terminal" means "node", "interconnection", "pin" and/or "lead". Unless specifically stated to the contrary, these terms generally mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, etc.), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Relative terms such as "top," "bottom," and the like indicate relative position with respect to the orientation being described or as shown in the drawing under discussion; such terms do not indicate absolute position or orientation. These terms do not require that any device or structure be constructed or operated in a particular orienta-tion. Unless otherwise stated, "about" or "approximately" preceding a value means +/−10 percent of the stated value.

Modifications of the described examples are possible, as are other examples, within the scope of the claims. Moreover, features described herein may be applied in other environments and applications consistent with the teachings provided.

What is claimed is:

1. An electrostatic discharge (ESD) protection device, comprising:

a first circuit including a first diode, a second diode, and a first Zener diode, an anode of the first diode coupled to an anode of the first Zener diode to form a first NPN structure; and a second circuit including a third diode, a fourth diode, and a second Zener diode, an anode of the third diode coupled to an anode of the second Zener diode to form a second NPN structure;

wherein the second diode is coupled in series to the first NPN structure, and the fourth diode is coupled in series to the second NPN structure.

2. The ESD protection device of claim 1, wherein a capacitance of the second diode is less than a capacitance of the first diode, and a capacitance of the fourth diode is less than a capacitance of the third diode.

3. The ESD protection device of claim 1, wherein a capacitance of the second diode is less than a capacitance of the first NPN structure, and a capacitance of the fourth diode is less than a capacitance of the second NPN structure.

4. The ESD protection device of claim 3, wherein:

a cathode of the first Zener diode is coupled to a cathode of the second diode, and a cathode of the second Zener diode is coupled to a cathode of the fourth diode.

5. The ESD protection device of claim 1, further comprising:

a substrate; and first and second terminals of the ESD protection device formed on the substrate.

6. The ESD protection device of claim 5, further comprising:

a first die disposed on a first portion of the substrate, wherein the first circuit is disposed on the first die; and a second die disposed on a second portion of the substrate, wherein the second circuit is disposed on the second die.

7. The ESD protection device of claim 6, further comprising:

a first connector coupling a cathode of the first diode to an anode of the fourth diode; and a second connector coupling an anode of the second diode to a cathode of the third diode.

8. The ESD protection device of claim 7, further comprising:

a first conductive die attach pad on which the first circuit is disposed, wherein the first terminal is coupled to the first circuit via the first conductive die attach pad; and a second conductive die attach pad on which the second circuit is disposed, wherein the second terminal is coupled to the second circuit via the second conductive die attach pad.

9. The ESD protection device of claim 7, further comprising:

a third connector coupling the cathode of the first diode to the first terminal; and a fourth connector coupling the cathode of the third diode to the second terminal.

10. An electrostatic discharge (ESD) protection device, comprising:

a first diode and a Zener diode, an anode of the first diode coupled to an anode of the Zener diode to form an NPN structure;

a second diode having an anode coupled to a cathode of the first diode and having a cathode coupled to a cathode of the Zener diode;

a third diode having a cathode coupled to the cathode of the Zener diode and to the cathode of the second diode; and a fourth diode having a cathode coupled to an anode of the third diode.

11. The ESD protection device of claim 10, further comprising:

a substrate including a main portion and first and second terminal portions;

first and second terminals of the ESD protection device formed on the first and second terminal portions, respectively;

a first die disposed on the main portion of the substrate, wherein the first, second and third diodes and the Zener diode are disposed on the first die; and a second die disposed on the main portion of the substrate, wherein the fourth diode is disposed on the second die.

12. The ESD protection device of claim 11, further comprising:

a first connector coupling the cathode of the first diode and the anode of the second diode to the first terminal; and a second connector coupling a cathode of the fourth diode to a second terminal of the ESD protection device.

13. The ESD protection device of claim 12, further comprising:

a third connector coupling the anode of the third diode to the cathode of the fourth diode.

14. A method of making an electrostatic discharge (ESD) protection device, the method comprising:

forming, on a substrate, first and second dies and first and second terminals of the ESD protection device;

forming, on the first die, a first circuit including a first diode, a second diode, and a first Zener diode, in which an anode of the first diode is coupled to an anode of the first Zener diode to form a first NPN structure, and the second diode is coupled in series with the first NPN structure; and forming, on the second die, a second circuit including a third diode, a fourth diode, and a second Zener diode, in which an anode of the third diode is coupled to an anode of the second Zener diode to form a second NPN structure, and the fourth diode is coupled in series with the second NPN structure.

15. The method of claim 14, wherein:

the forming of the first circuit on the first die includes coupling a cathode of the first Zener diode to a cathode of the second diode; and the forming of the second circuit on the second die includes coupling a cathode of the second Zener diode to a cathode of the fourth diode.

16. The method of claim 15, further comprising:

coupling a cathode of the first diode to an anode of the fourth diode; and coupling an anode of the second diode to a cathode of the third diode.

17. The method of claim 14, further comprising:

coupling a cathode of the second diode and a cathode of the first Zener diode to the first terminal; and coupling a cathode of the fourth diode and a cathode of the second Zener diode to the second terminal.

18. A method of making an electrostatic discharge (ESD) protection device, the method comprising:

forming, on a substrate, first and second dies and first and second terminals of the ESD protection device;

forming, on the first die, a first circuit including a first diode, a second diode, a third diode, and a Zener diode, in which an anode of the first diode is coupled to an anode of the Zener diode to form a first NPN structure, and the second diode is coupled in parallel with the first NPN structure;

forming, on the second die, a fourth diode; and coupling an anode of the third diode to a cathode of the fourth diode.

19. The method of claim 18, further comprising:

coupling a cathode of the first diode and an anode of the second diode to the first terminal; and coupling the cathode of the fourth diode to the second terminal.

* * * * *